(12) United States Patent
Ho et al.

(10) Patent No.: US 9,768,069 B2
(45) Date of Patent: Sep. 19, 2017

(54) METHOD OF MANUFACTURING SEMICONDUCTOR DEVICE

(71) Applicant: TAIWAN SEMICONDUCTOR MANUFACTURING CO., LTD., Hsinchu (TW)

(72) Inventors: Wei-Shuo Ho, New Taipei (TW); Tsung-Yu Chiang, New Taipei (TW); Chia-Chun Liao, Hsinchu (TW); Kuang-Hsin Chen, Jung-Li (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/070,802

(22) Filed: Mar. 15, 2016

(65) Prior Publication Data

US 2016/0197016 A1    Jul. 7, 2016

Related U.S. Application Data

(62) Division of application No. 14/174,379, filed on Feb. 6, 2014, now Pat. No. 9,306,023.

(51) Int. Cl.
| | |
|---|---|
| *H01L 21/8234* | (2006.01) |
| *H01L 29/49* | (2006.01) |
| *H01L 27/088* | (2006.01) |
| *H01L 21/28* | (2006.01) |
| *H01L 29/66* | (2006.01) |

(Continued)

(52) U.S. Cl.
CPC ........ *H01L 21/823437* (2013.01); *H01L 21/28088* (2013.01); *H01L 21/28556* (2013.01); *H01L 21/28568* (2013.01); *H01L 21/82345* (2013.01); *H01L 27/088* (2013.01); *H01L 29/4966* (2013.01); *H01L 29/66545* (2013.01); *H01L 29/517* (2013.01)

(58) Field of Classification Search
CPC ..... H01L 21/823462; H01L 21/823842; H01L 21/823857; H01L 27/112; H01L 27/105
See application file for complete search history.

(56) References Cited

U.S. PATENT DOCUMENTS

| | | | |
|---|---|---|---|
| 6,893,924 B2 * | 5/2005 | Visokay | ........... H01L 21/28088 257/E21.204 |
| 9,293,550 B2 * | 3/2016 | Fumitake | ................ H01L 29/78 |
| 2010/0187610 A1 | 7/2010 | Kwon et al. | |

(Continued)

*Primary Examiner* — Quoc Hoang
(74) *Attorney, Agent, or Firm* — Birch, Stewart, Kolasch & Birch, LLP

(57) ABSTRACT

A method for forming a semiconductor device is provided. The method includes providing a semiconductor substrate with an insulating layer formed thereon. The method includes forming a gate dielectric layer in the first opening and the second opening. The method includes forming a film over the gate dielectric layer. The method includes forming a first work function metal layer in the first opening. The method includes depositing a second work function metal layer in the first opening and the second opening and in direct contact with the first work function metal layer in the first opening and the film in the second opening. A first deposition rate of the second work function metal layer over the first work function metal layer is greater than a second deposition rate of the second work function metal layer over the film.

18 Claims, 8 Drawing Sheets

(51) Int. Cl.
*H01L 21/285* (2006.01)
*H01L 29/51* (2006.01)

(56) References Cited

U.S. PATENT DOCUMENTS

| | | |
|---|---|---|
| 2014/0001543 A1 | 1/2014 | Kim et al. |
| 2014/0239405 A1 | 8/2014 | Ha et al. |
| 2015/0145057 A1* | 5/2015 | Fan ................ H01L 27/092 257/369 |

* cited by examiner

METHOD OF MANUFACTURING SEMICONDUCTOR DEVICE

CROSS REFERENCE TO RELATED APPLICATIONS

This application is a Divisional application of co-pending U.S. application Ser. No. 14/174,379, filed on Feb. 6, 2014, the entire content of which is hereby incorporated by reference.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

A system-on-chip (SoC) device integrates various functions on a single chip, and the system-on-chip device has transistors with different threshold voltages. In the process of forming the transistors, an ion implantation process is performed on the channels of the transistors to adjust the threshold voltages of the transistors. However, in some embodiments, since the feature sizes continue to decrease, the ion implantation process is unable to adjust the threshold voltages of the transistors accurately. To solve the problem mentioned above, a manufacturing method of a system-on-chip device is provided as follows.

Figure 1A:
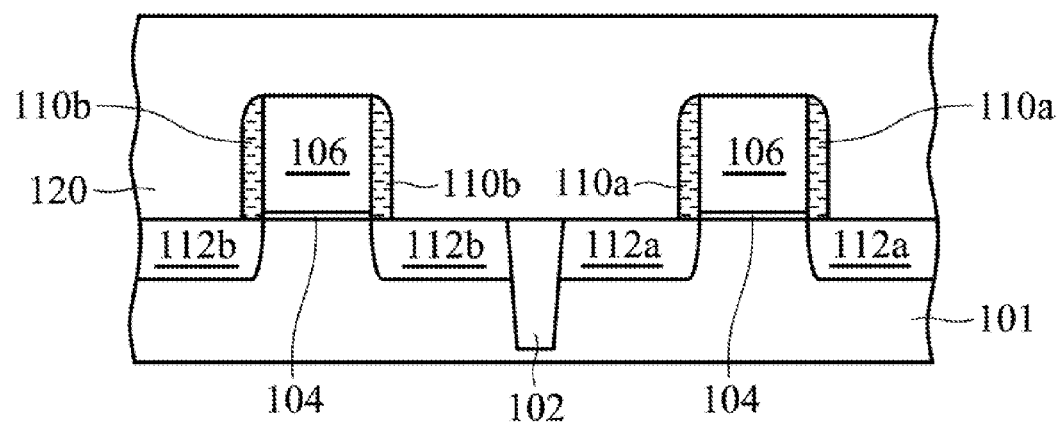
FIGS. 1A-1H are cross-sectional views of various stages of a process for forming a semiconductor device, in accordance with some embodiments.

FIGS. 1A-1H are cross-sectional views of various stages of a process for forming a semiconductor device 100a, in accordance with some embodiments. Referring to FIG. 1A, a semiconductor substrate 101 is provided. The semiconductor substrate 101 may be a semiconductor wafer (such as a silicon wafer) or a portion of a semiconductor wafer.

In some embodiments, the semiconductor substrate 101 is made of an elementary semiconductor material including silicon or germanium in a single crystal, polycrystal, or amorphous structure. In some other embodiments, the semiconductor substrate 101 is made of a compound semiconductor, such as silicon carbide, gallium arsenide, gallium phosphide, indium phosphide, indium arsenide, an alloy semiconductor, such as SiGe, or GaAsP, or combinations thereof. The semiconductor substrate 101 may also include multi-layer semiconductors, semiconductor on insulator (SOI) (such as silicon on insulator or germanium on insulator), or a combination thereof.

An isolation structure 102 is formed in the semiconductor substrate 101 to define various active regions in the semiconductor substrate 101, and to electrically isolate neighboring devices (e.g. transistors) from one another. The isolation structure 102 may be made of a dielectric material, such as silicon oxide, silicon nitride, silicon oxynitride, fluoride-doped silicate glass (FSG), a low-K dielectric material, other suitable materials, or combinations thereof. The isolation structure 102 may be formed by using an isolation technology, such as local oxidation of semiconductor (LOCOS), shallow trench isolation (STI), or the like.

In some embodiments, the formation of the isolation structure 102 includes patterning the semiconductor substrate 101 by a photolithography process, etching a trench in the semiconductor substrate 101 (for example, by using a dry etching, wet etching, plasma etching process, or combinations thereof), and filling the trench (for example, by using a chemical vapor deposition process) with the dielectric material. In some embodiments, the filled trench may have a multi-layer structure, such as a thermal oxide liner layer filled with silicon nitride or silicon oxide. However, in some embodiments, the isolation structure 102 is optional.

As shown in FIG. 1A, the gate dielectric layers 104 and the dummy gates 106 are formed over the semiconductor substrate 101 for defining active regions in the semiconductor substrate 101. A gate-last approach or replacement-gate (RPG) approach will be subsequently performed to form metal gates. The dummy gates 106 may be made of poly silicon.

The gate dielectric layers 104 may serve as dummy gate dielectric layers and are removed in a subsequent process. The gate dielectric layers 104 may be made of silicon oxide. However, in some other embodiments, the gate dielectric layers 104 do not serve as dummy gate dielectric layers and will not be subsequently removed. In these cases, the gate dielectric layers 104 may be made of silicon oxide, silicon oxynitride, a high dielectric constant material (high-k material), or combinations thereof.

As shown in FIG. 1A, spacers 110a and 110b are formed over sidewalls of the dummy gates 106. The spacers 110a and 110b may be made of a dielectric material, such as silicon nitride layer, silicon oxynitride layer, or combinations thereof. The structure of the spacers 110a and 110b shown in FIG. 1A is merely an example. Other configurations of the spacers 110a and 110b are also possible. For example, a sealing layer (not shown) is formed between the spacers 110a and 110b and the dummy gates 106.

Doped regions 112a and 112b may be formed in the semiconductor substrate 101 by using a suitable process, such as an ion implantation process. The doped regions 112a may be a heavily doped source region and a heavily doped drain region. The doped regions 112b may be a heavily doped source region and a heavily doped drain region. The doped regions 112a and 112b may be formed after the spacers 110a and 110b are formed.

As shown in FIG. 1A, an insulating layer 120 is then deposited over the dummy gates 106 and the semiconductor substrate 101, in accordance with some embodiments. The insulating layer 120 may be made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof. The insulating layer 120 may be deposited by any suitable process, such as a chemical vapor deposition (CVD) process, HDPCVD process, spin-on process, sputtering process, or combinations thereof.

Figure 1B:
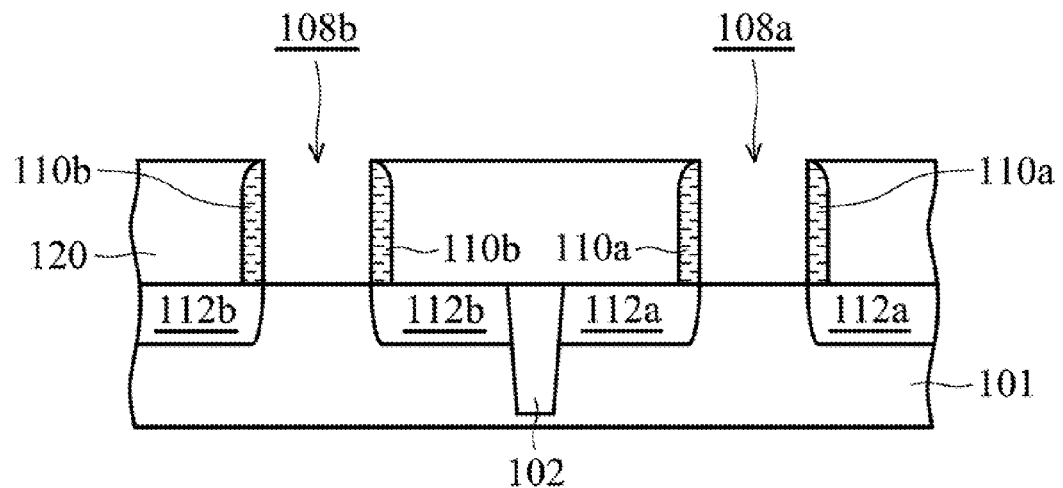

Afterwards, as shown in FIG. 1B, a planarization process, such as a chemical mechanical polishing (CMP) or the like, is then performed on the insulating layer 120 until top surfaces of the dummy gates 106 are exposed. After the planarization process is performed, the insulating layer 120 may have a substantially planar surface to facilitate subsequent process steps.

Then, the dummy gates 106 are removed by using a suitable process, such as a wet etching process, a dry etching process, or combinations thereof. In some embodiments, the gate dielectric layers 104 are also removed. After the dummy gates 106 and the gate dielectric layers 104 are removed, openings 108a and 108b are formed between the spacers 110a and between the spacers 110b, respectively. The openings 108a and 108b may be trenches.

Figure 1C:
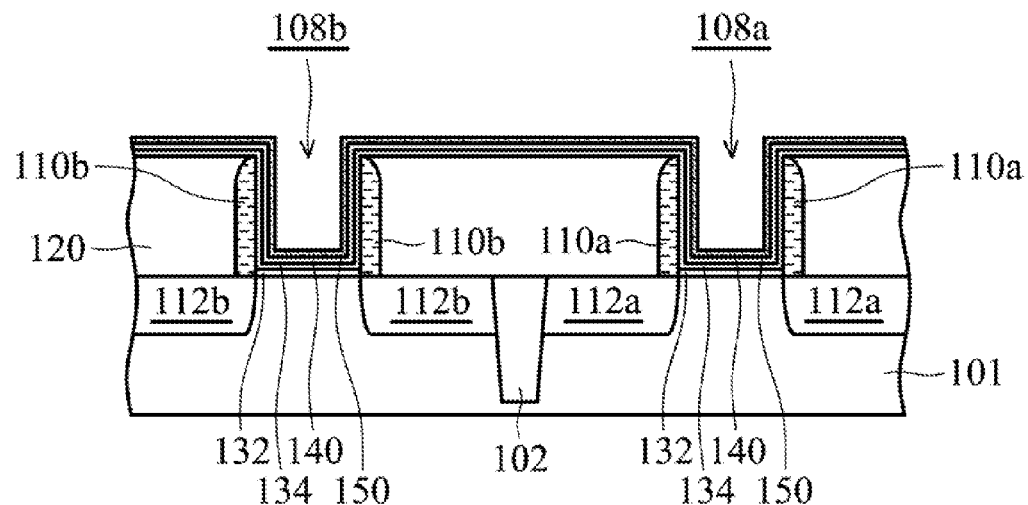

As shown in FIG. 1C, an interfacial layer 132 may be formed over bottoms of the openings 108a and 108b. The interfacial layer 132 may be made of a suitable dielectric material, such as silicon oxide, hafnium silicate, silicon oxynitride, or combinations thereof. In some embodiments, the interfacial layer 132 is formed by thermal oxidation. In some other embodiments, the interfacial layer 132 is formed by chemical vapor deposition (CVD) or any other suitable process.

Thereafter, a gate dielectric layer 134 is deposited over the semiconductor substrate 101 to cover the bottoms of the openings 108a and 108b, in accordance with some embodiments. The gate dielectric layer 134 may be made of a dielectric material, such as a high dielectric constant (high-k) material. The high-k material may be made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof.

The high-k material may be further made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof.

The gate dielectric layer 134 may be deposited by any suitable process, such as atomic layer deposition (ALD), chemical vapor deposition (CVD), physical vapor deposition (PVD), sputtering, plating, other suitable processes, or combinations thereof. In some embodiments, the gate dielectric layer 134 needs to be further annealed.

Afterwards, a capping layer 140 may be deposited over the gate dielectric layer 134 to protect the gate dielectric layer 134 from being affected by the subsequent processes. The capping layer 140 may be made of metal carbonitride (such as titanium carbonitride or tantalum carbonitride) or metal nitride (such as titanium nitride or tantalum nitride). The capping layer 140 may be deposited by any suitable process, such as chemical vapor deposition, atomic layer deposition or physical vapor deposition.

Thereafter, a barrier layer 150 may be deposited over the capping layer 140. The barrier layer 150 is configured to prevent the diffusion of the metals of work function metal layers formed subsequently into the gate dielectric layer 134. The barrier layer 150 may be made of metal carbonitride (such as titanium carbonitride or tantalum carbonitride) or metal nitride (such as titanium nitride or tantalum nitride). The barrier layer 150 may be deposited by any suitable process, such as chemical vapor deposition, atomic layer deposition or physical vapor deposition.

Figure 1D:
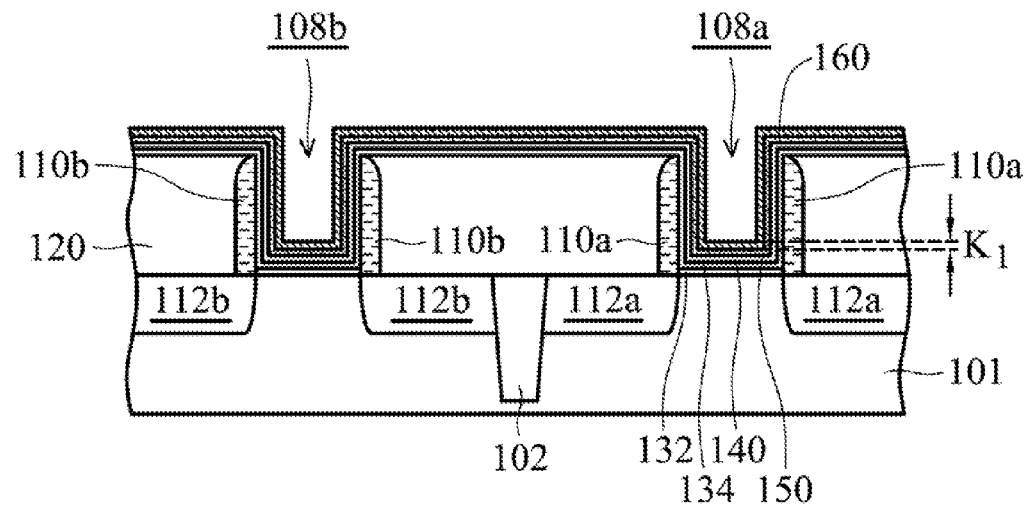

As shown in FIG. 1D, a first work function metal layer 160 is formed over the barrier layer 150 and in the openings 108a and 108b. The first work function metal layer 160 may be made of metal carbonitride, metal aluminide (such as TiAlN, TiAl, or TaAl), metal silicon nitride (such as TiSiN) or metal nitride (such as TiN). The first work function metal layer 160 may be deposited by any suitable process, such as chemical vapor deposition, atomic layer deposition or physical vapor deposition. In some embodiments, a thickness K1 of the first work function metal layer 160 ranges from about 1 Å to about 20 Å.

Figure 1E:
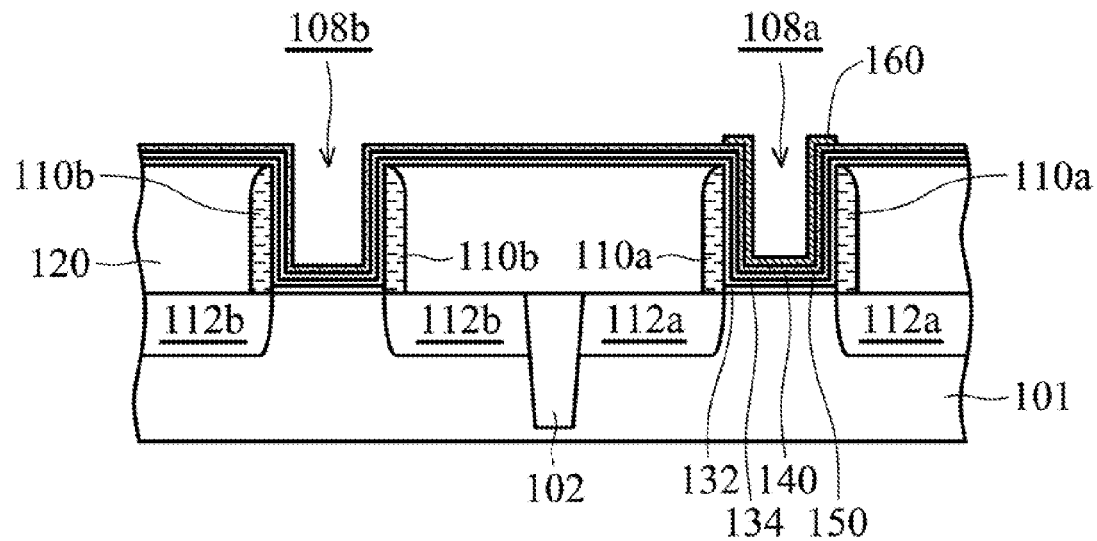

Thereafter, as shown in FIG. 1E, the first work function metal layer 160 is patterned to remove a portion of the first work function metal layer 160 in the opening 108b and outside of the openings 108a and 108b. The patterning process includes, for example, a photolithography process and an etching process. The remaining portion of the first work function metal layer 160 is located in the opening 108a and over the opening 108a.

Figure 1F:
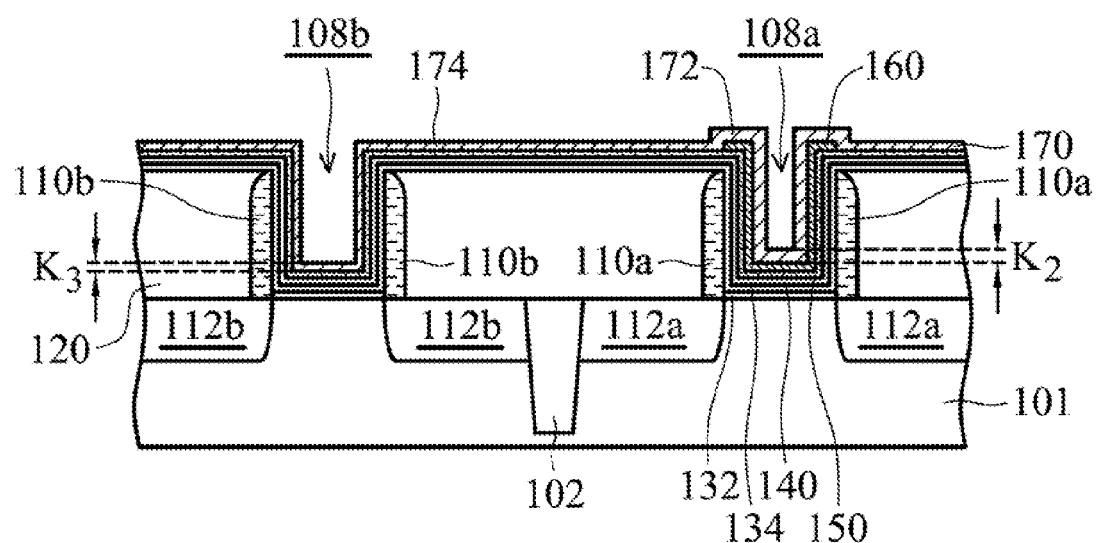

Afterwards, as shown in FIG. 1F, a second work function metal layer 170 is deposited on the barrier layer 150 and the first work function metal layer 160 and in the openings 108a and 108b. The second work function metal layer 170 may be made of metal carbonitride, metal aluminide (such as TiAlN, TiAl, or TaAl), metal silicon nitride (such as TiSiN) or metal nitride (such as TiN).

In some embodiments, the second work function metal layer 170 and the first work function metal layer 160 have the same metal element, and the second work function metal layer 170 and the barrier layer 150 do not have the same metal element. The metal element includes titanium (Ti), aluminum (Al), tantalum (Ta) or other suitable metal elements. In some embodiments, the first work function metal layer 160 and the barrier layer 150 are made of different materials.

The second work function metal layer 170 may be deposited by an atomic layer deposition (ALD) process or a chemical vapor deposition (CVD) process. The precursors used in the ALD process or the CVD process tend to deposit on the film with the same metal element as the precursor. Therefore, the deposition rate on the first work function metal layer 160 is greater than that on the barrier layer 150.

Hence, the second work function metal layer 170 has a thick portion 172 directly on the first work function metal layer 160 and a thin portion 174 directly on the barrier layer 150, in accordance with some embodiments. The thick portion 172 may be in direct contact with the first work function metal layer 160, and the thin portion 174 may be in direct contact with the barrier layer 150. The thick portion 172 has a thickness K2 larger than a thickness K3 of the thin portion 174.

The ratio of the thickness K2 to the thickness K3 ranges from, for example, about 1.2 to about 3. In some embodiments, the thickness K2 ranges from about 1.2 Å to about 60 Å. In some embodiments, the thickness K3 ranges from about 1 Å to about 20 Å.

An incubation time of the atomic layer deposition process (or the chemical vapor deposition process) is defined as the time for applying the precursor (the precursor gases) into the reaction furnace to deposit a film on a substrate in the reaction furnace. The incubation time of the second work function metal layer 170 may range from about 0.1 minutes to about 3 minutes. If the incubation time of the second work function metal layer 170 is too long, the deposition rate difference on the first work function metal layer 160 and the barrier layer 150 may be decreased. Therefore, the thick portion 172 and the thin portion 174 may have similar thicknesses, which are not desired.

Figure 1G:
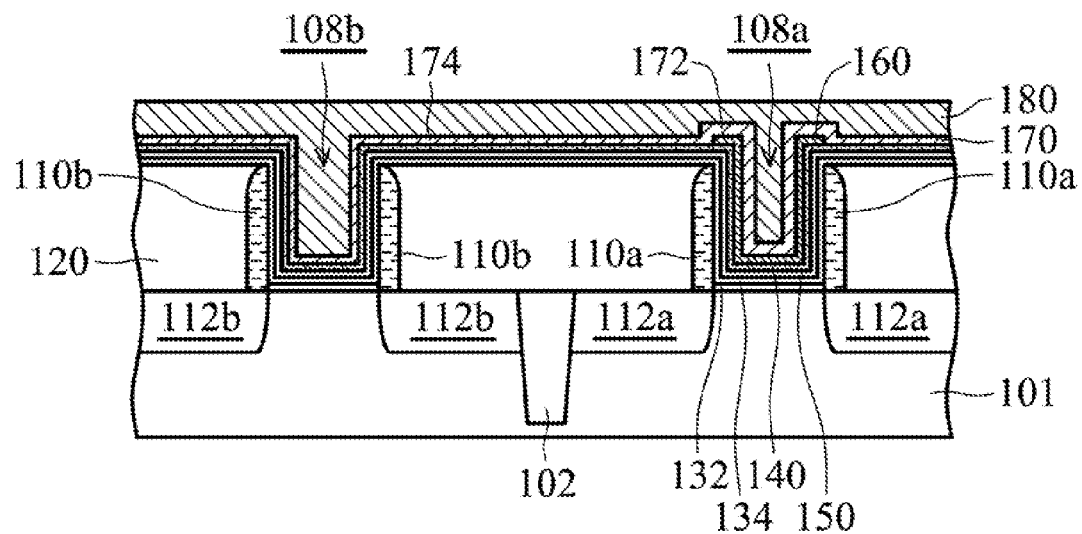

As shown in FIG. 1G, a gate electrode layer 180 (also called a metal gate electrode layer) is then deposited over the second work function metal layer 170 to fill the openings 108a and 108b. The gate electrode layer 180 may be made of a suitable metal material, such as aluminum, tungsten, gold, platinum, cobalt, other suitable metal, alloy thereof, or combinations thereof. The gate electrode layer 180 may be deposited by using a PVD process, CVD process, plating process, the like, or combinations thereof.

Figure 1H:
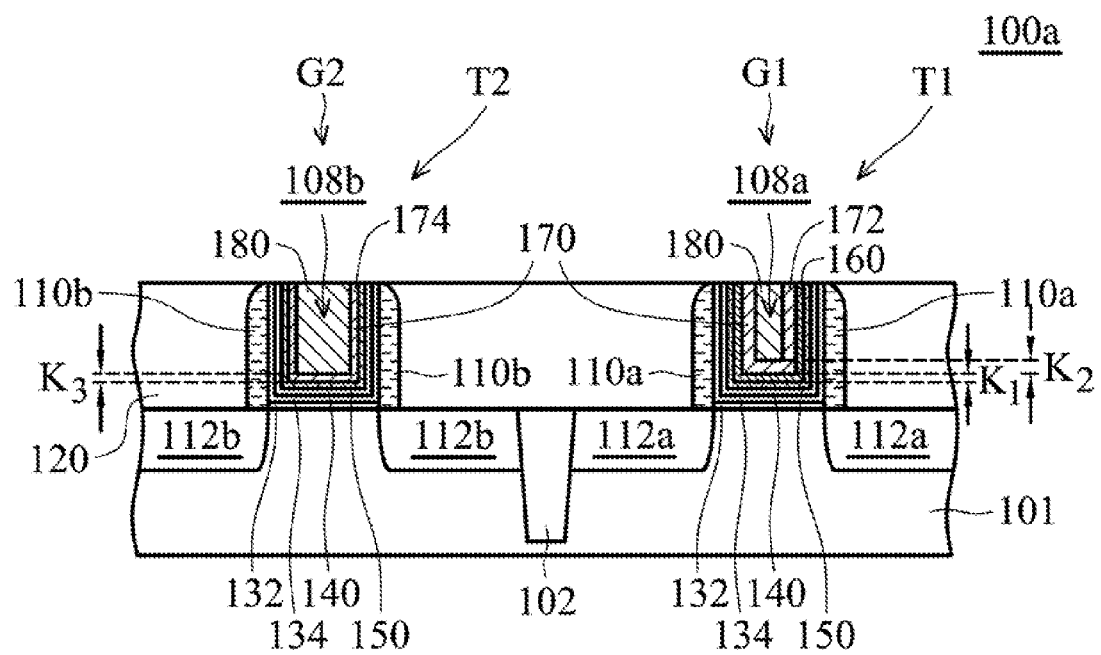

Afterwards, as shown in FIG. 1H, a planarization process is performed to remove the gate electrode layer 180, the second work function metal layer 170, the first work function metal layer 160, the barrier layer 150, the capping layer 140 and the gate dielectric layer 134 outside of the openings 108a and 108b. The planarization process includes a chemical mechanical polishing (CMP) process or the like. In this step, the semiconductor device 100a is substantially formed.

In the opening 108a, the gate electrode layer 180, the thick portion 172 of the second work function metal layer 170, the first work function metal layer 160, the barrier layer 150, the capping layer 140, the gate dielectric layer 134 and the interfacial layer 132 together form a first gate stack G1 (i.e., a metal gate stack). The first gate stack G1 is surrounded by the insulating layer 120. The gate electrode layer 180 remaining in the opening 108a may serve as a first metal gate electrode of the first gate stack G1. The first gate stack G1 and the doped regions 112a together form a first transistor T1.

In the opening 108b, the gate electrode layer 180, the thin portion 174 of the second work function metal layer 170, the barrier layer 150, the capping layer 140, the gate dielectric layer 134 and the interfacial layer 132 together form a second gate stack G2 (i.e., a metal gate stack). The second gate stack G2 is surrounded by the insulating layer 120. The gate electrode layer 180 remaining in the opening 108b may serve as a second metal gate electrode of the second gate stack G2. The second gate stack G2 and the doped regions 112b together form a second transistor T2.

According to the above descriptions, it is known that the thickness K2 of the thick portion 172 is larger than the thickness K3 of the thin portion 174. Therefore, the total work function metal layer thickness of the first transistor T1 (i.e., K1+K2) is larger than that of the second transistor T2 (i.e., K3).

The first and the second work function metal layers 160 and 170 are configured to adjust the threshold voltages of the first and the second transistors T1 and T2. Therefore, the first transistor T1 with a larger total work function metal layer thickness has a lower threshold voltage than that of the second transistor T2. The first transistor T1 may have an ultra-low threshold voltage (ULVT), and the second transistor T2 may have a standard threshold voltage (SVT).

The second work function metal layer 170 has different thicknesses in the first and the second transistors T1 and T2 (i.e., K2 and K3, and K2>K3). Therefore, the first work function metal layer 160 in the first transistor T1 may have a small thickness K1, which is still able to achieve that the threshold voltage of the first transistor T1 is lower than that of the second transistor T2.

Hence, the etching time for removing the portion of the first work function metal layer 160 (as shown in FIG. 1E) may be short. Therefore, it avoids the problems of damage to the barrier layer 150 (or the capping layer 140) and an increase of the gate leakage current of the second transistor T2 due to a long etching time. As a result, the process yield and the reliability of the semiconductor device 100a are improved.

The total work function metal layer thickness difference between the first transistor T1 (i.e., the sum of the thicknesses K1 and K2) and the second transistor T2 (i.e., the thickness K3) may be adjusted according to requirements. The adjusting method includes adjusting the thickness K1 of the first work function metal layer 160, the materials of the barrier layer 150, the first and the second work function metal layers 160 and 170, and the incubation time of the second work function metal layer 170.

Figure 2:
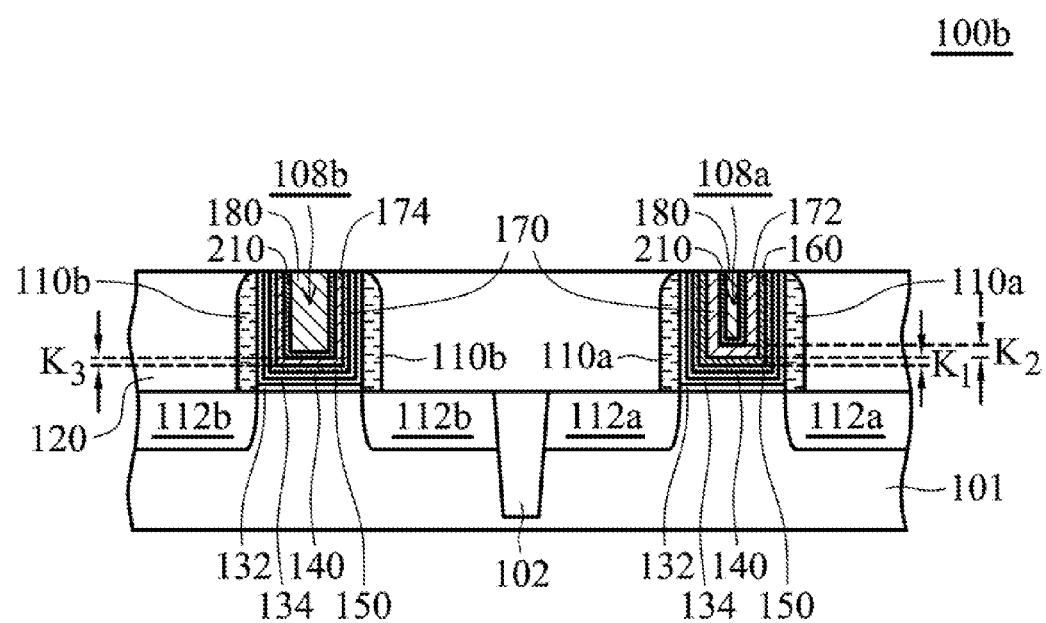
FIG. 2 is a cross-sectional view of a semiconductor device, in accordance with some embodiments.

FIG. 2 is a cross-sectional view of a semiconductor device 100b, in accordance with some embodiments. In some other embodiments, as shown in FIG. 2, the semiconductor device 100b further includes another work function metal layer 210 between the second work function metal layer 170 and the gate electrode layer 180.

The work function metal layer 210 may be made of metal carbonitride, metal aluminide (such as TiAlN, TiAl, or TaAl), metal silicon nitride (such as TiSiN) or metal nitride (such as TiN). The work function metal layer 210 may be deposited by any suitable process, such as chemical vapor deposition, atomic layer deposition or physical vapor deposition.

In still other embodiments, the semiconductor device 100b further includes many work function metal layers (not shown) between the second work function metal layer 170 and the gate electrode layer 180.

Figure 3A:
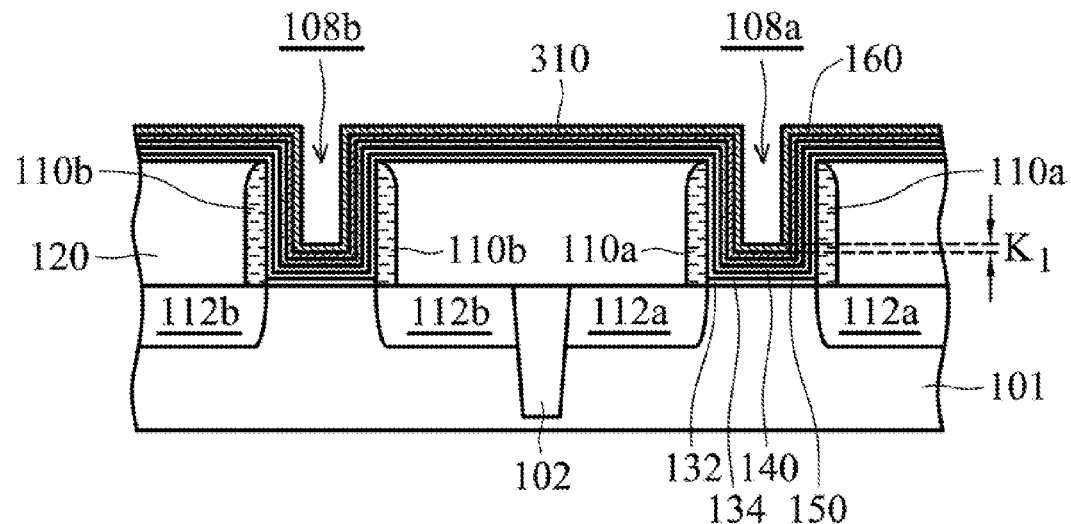
FIGS. 3A-3E are cross-sectional views of various stages of a process for forming a semiconductor device, in accordance with some embodiments.

FIGS. 3A-3E are cross-sectional views of various stages of a process for forming a semiconductor device 100c, in accordance with some embodiments. After the step of FIG. 1C, as shown in FIG. 3A, a third work function metal layer 310 is deposited over the barrier layer 150 and in the openings 108a and 108b. The third work function metal layer 310 may be made of metal carbonitride, metal aluminide (such as TiAlN, TiAl, or TaAl), metal silicon nitride (such as TiSiN) or metal nitride (such as TiN). The third work function metal layer 310 may be deposited by any suitable process, such as chemical vapor deposition, atomic layer deposition or physical vapor deposition.

Thereafter, a first work function metal layer 160 is formed over the third work function metal layer 310 and in the openings 108a and 108b. The first work function metal layer 160 may be made of metal carbonitride, metal aluminide (such as TiAlN, TiAl, or TaAl), metal silicon nitride (such as TiSiN) or metal nitride (such as TiN). In some embodiments, a thickness K1 of the first work function metal layer 160 ranges from about 1 Å to about 20 Å.

Figure 3B:
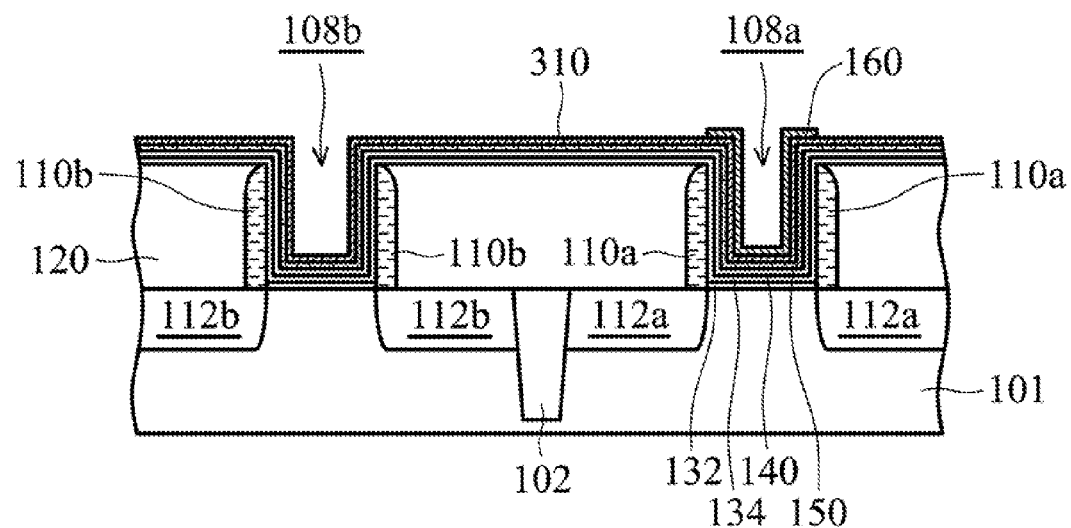

Thereafter, as shown in FIG. 3B, the first work function metal layer 160 is patterned to remove a portion of the first work function metal layer 160 in the opening 108b and outside of the openings 108a and 108b. The patterning process includes, for example, a photolithography process and an etching process. The remaining portion of the first work function metal layer 160 is in the opening 108a and over the opening 108a.

Figure 3C:
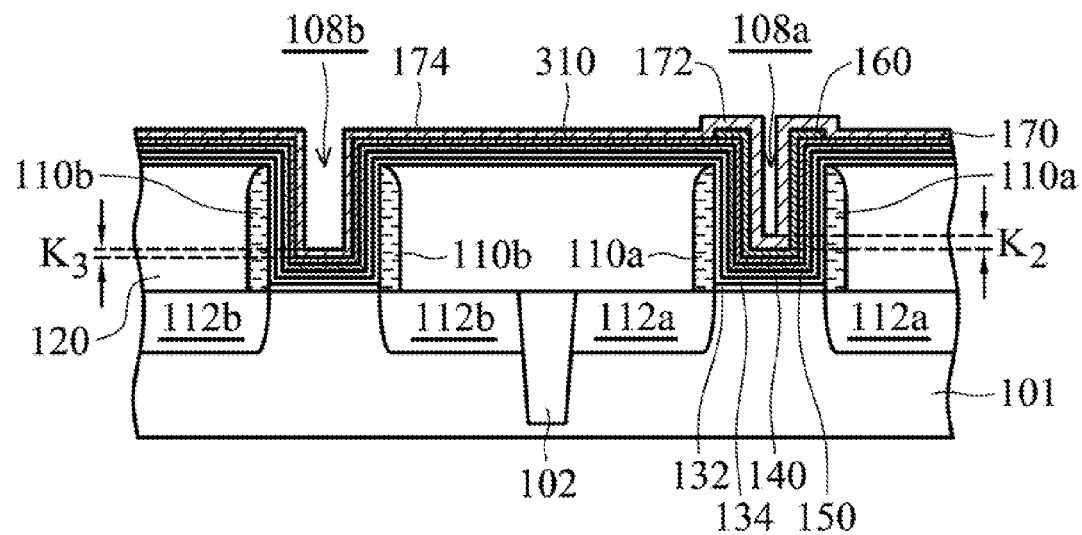

Afterwards, as shown in FIG. 3C, a second work function metal layer 170 is deposited over the third work function metal layer 310 and the first work function metal layer 160 and in the openings 108a and 108b. The second work function metal layer 170 may be made of metal carbonitride, metal aluminide (such as TiAlN, TiAl, or TaAl), metal silicon nitride (such as TiSiN) or metal nitride (such as TiN).

In some embodiments, the second work function metal layer 170 and the first work function metal layer 160 have the same metal element, and the second work function metal layer 170 and the third work function metal layer 310 do not have the same metal element. The metal element includes, for example, titanium (Ti), aluminum (Al) or tantalum (Ta). In some embodiments, the first work function metal layer 160 and the third work function metal layer 310 are made of different materials.

The second work function metal layer 170 may be deposited by an atomic layer deposition (ALD) process or a chemical vapor deposition (CVD) process. The incubation time of the second work function metal layer 170 may range from about 0.1 to about 3 minutes. The precursors used in the ALD process or the CVD process tend to deposit on the film with the same metal element as the precursors. Therefore, the deposition rate on the first work function metal layer 160 is greater than that on the third work function metal layer 310.

Hence, the second work function metal layer 170 has a thick portion 172 directly on the first work function metal layer 160 and a thin portion 174 directly on the third work function metal layer 310, in accordance with some embodiments. The thick portion 172 may be in direct contact with the first work function metal layer 160, and the thin portion 174 may be in direct contact with the third work function metal layer 310. The thick portion 172 has a thickness K2 larger than a thickness K3 of the thin portion 174.

The ratio of the thickness K2 to the thickness K3 ranges from, for example, about 1.2 to about 3. In some embodiments, the thickness K2 ranges from about 1.2 Å to about 60 Å. In some embodiments, the thickness K3 ranges from about 1 Å to about 20 Å.

Figure 3D:
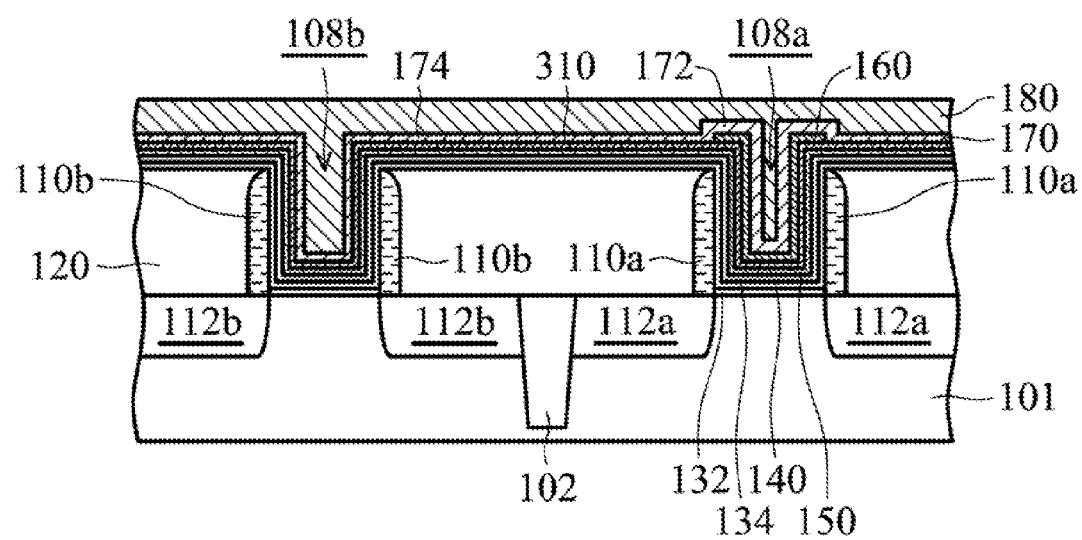

As shown in FIG. 3D, a gate electrode layer 180 (also called a metal gate electrode layer) is then deposited over the second work function metal layer 170 to fill the openings 108a and 108b.

Figure 3E:
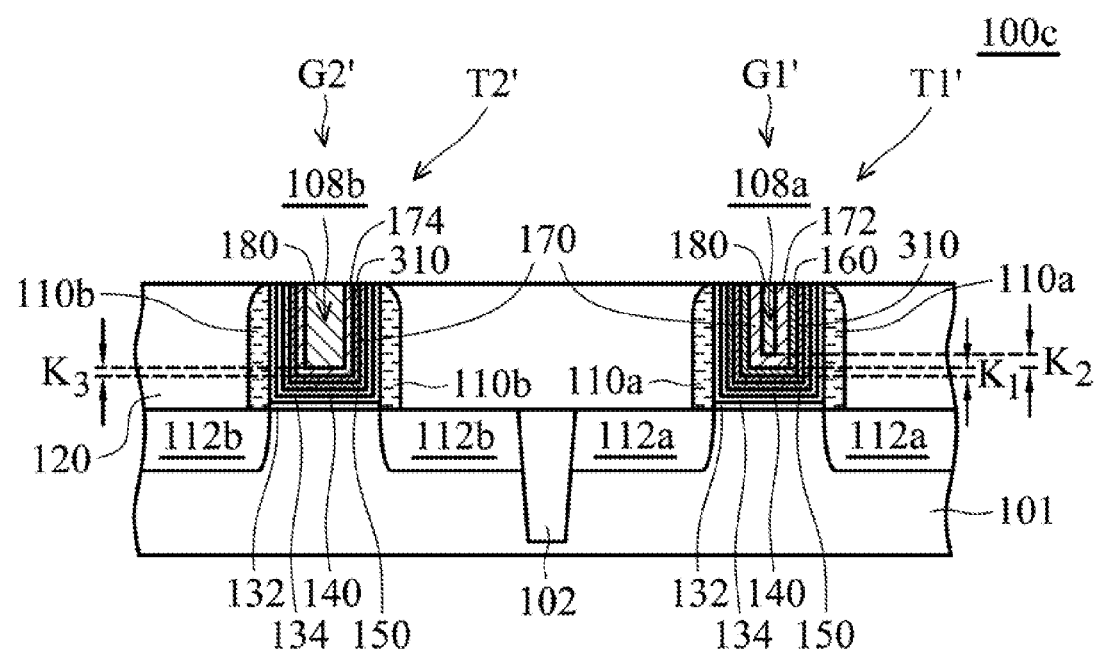

Afterwards, as shown in FIG. 3E, a planarization process is performed to remove the gate electrode layer 180, the second work function metal layer 170, the first work function metal layer 160, the third work function metal layer 310, the barrier layer 150, the capping layer 140 and the gate dielectric layer 134 outside of the openings 108a and 108b. In this step, the semiconductor device 100c is substantially formed.

In the opening 108a, the gate electrode layer 180, the thick portion 172 of the second work function metal layer 170, the first work function metal layer 160, the third work function metal layer 310, the barrier layer 150, the capping layer 140, the gate dielectric layer 134 and the interfacial layer 132 together form a first gate stack G1' (i.e., a metal gate stack). The third work function metal layer 310 of the first gate stack G1' is disposed between the barrier layer 150 and the first work function metal layer 160, in accordance with some embodiments. The first gate stack G1' is surrounded by the insulating layer 120. The gate electrode layer 180 remaining in the opening 108a may serve as a first metal gate electrode of the first gate stack G1'. The first gate stack G1' and the doped regions 112a together form a first transistor T1'.

In the opening 108b, the gate electrode layer 180, the thin portion 174 of the second work function metal layer 170, the third work function metal layer 310, the barrier layer 150, the capping layer 140, the gate dielectric layer 134 and the interfacial layer 132 together form a second gate stack G2' (i.e., a metal gate stack). The second gate stack G2' is surrounded by the insulating layer 120. The gate electrode layer 180 remaining in the opening 108b may serve as a second metal gate electrode of the second gate stack G2'. The second gate stack G2' and the doped regions 112b together form a second transistor T2'.

The total work function metal layer thickness difference between the first and the second transistors T1' and T2' (i.e., K1+K2−K3) may be adjusted according to requirements. The adjusting method includes adjusting the thickness K1 of the first work function metal layer 160, the materials of the third work function metal layer 310, the first and the second work function metal layers 160 and 170, and the incubation time of the second work function metal layer 170.

The second work function metal layer 170 has different thicknesses in the first and the second transistors T1' and T2' (i.e., K2 and K3, and K2>K3). Therefore, the first work function metal layer 160 in the first transistor T1 may have a small thickness K1, which is still able to achieve that the threshold voltage of the first transistor T1' is lower than that of the second transistor T2'.

Hence, the etching time for removing the portion of the first work function metal layer 160 (as shown in FIG. 3B) may be short. Therefore, it avoids the problems of damage to the third work function metal layer 310 (and/or the barrier layer 150) due to a long etching time. As a result, the process yield of the semiconductor device 100c is improved.

Besides, the third work function metal layer 310 is used to adjust the threshold voltages of both the first transistor T1' and the second transistor T2', in accordance with some embodiments. The threshold voltage of the first transistor T1' may be adjusted by adjusting the first work function metal layer 160, the thick portion 172 of the second work function metal layer 170, and the third work function metal layer 310. The threshold voltage of the second transistor T2' may be adjusted by adjusting the thin portion 174 of the second work function metal layer 170 and the third work function metal layer 310. Therefore, the third work function metal layer 310 may improve the flexibility of adjusting the threshold voltages of the first transistor T1' and the second transistor T2', which helps the first transistor T1' and the second transistor T2' to have desirable threshold voltages.

Embodiments of mechanisms for forming a semiconductor device as described above include forming a second work function metal layer having different thicknesses in different gate stacks to form a first and a second transistors with different threshold voltages. Therefore, the thickness of a first work function metal layer used for adjusting the threshold voltage of the first transistor may be reduced, and the etching time for patterning the first work function metal layer is also reduced. Hence, it prevents the damage of the film under the first work function metal layer due to a long etching time, and the process yield and the reliability of the semiconductor device are improved.

In accordance with some embodiments, a method for forming a semiconductor device is provided. The method includes providing a semiconductor substrate with an insulating layer formed thereon. The insulating layer has a first opening and a second opening. The method includes forming a gate dielectric layer in the first opening and the second opening. The method includes forming a film over the gate dielectric layer. The film includes a barrier layer or a metal layer. The method includes forming a first work function metal layer in the first opening. The method includes depositing a second work function metal layer in the first opening and the second opening and in direct contact with the first work function metal layer in the first opening and the film in the second opening. A first deposition rate of the second work function metal layer over the first work function metal layer is greater than a second deposition rate of the second work function metal layer over the film.

In accordance with some embodiments, a method for forming a semiconductor device is provided. The method includes providing a semiconductor substrate with an insulating layer formed thereon. The insulating layer has a first opening and a second opening. The method includes forming a gate dielectric layer in the first opening and the second opening. The method includes forming a film over the gate dielectric layer. The film includes a barrier layer or a metal layer. The method includes forming a first work function metal layer over the film in the first opening. The method includes forming a second work function metal layer in the first opening and the second opening and in direct contact with the first work function metal layer in the first opening and the film in the second opening. The second work function metal layer has a first portion over the first work function metal layer and a second portion over the film, and the first portion is thicker than the second portion.

In accordance with some embodiments, a method for forming a semiconductor device is provided. The method includes providing a semiconductor substrate with an insulating layer formed thereon. The insulating layer has a first opening and a second opening. The method includes forming a gate dielectric layer in the first opening and the second opening. The method includes forming a film over the gate dielectric layer. The film includes a barrier layer or a metal layer. The method includes forming a first work function metal layer in the first opening. The method includes depositing a second work function metal layer in the first opening and the second opening and in direct contact with the first work function metal layer in the first opening and the film in the second opening. The second work function metal layer and the first work function metal layer include a same metal element, and the second work function metal layer and the film are made of different materials.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device, comprising:
    providing a semiconductor substrate with an insulating layer formed thereon, wherein the insulating layer has a first opening and a second opening;
    forming a gate dielectric layer in the first opening and the second opening;
    forming a film over the gate dielectric layer, wherein the film comprises a barrier layer or a metal layer;
    forming a first work function metal layer in the first opening; and
    depositing a second work function metal layer in the first opening and the second opening and in direct contact with the first work function metal layer in the first opening and the film in the second opening, wherein a first deposition rate of the second work function metal layer over the first work function metal layer is greater than a second deposition rate of the second work function metal layer over the film,
    wherein the second work function metal layer and the first work function metal layer comprise a same metal element, and the second work function metal layer and the film do not comprise a same metal element.

2. The method for forming a semiconductor device as claimed in claim 1, further comprising:
    forming a gate electrode layer over the second work function metal layer.

3. The method for forming a semiconductor device as claimed in claim 2, wherein the formation of the film comprises:
    depositing the film in the first opening and the second opening, wherein the first work function metal layer is formed over the film.

4. The method for forming a semiconductor device as claimed in claim 3, wherein the formation of the first work function metal layer, the second work function metal layer, and the gate electrode layer comprises:
depositing the first work function metal layer in the first opening;
depositing the second work function metal layer in the first opening and the second opening and over the insulating layer;
depositing the gate electrode layer over the second work function metal layer; and
removing the gate electrode layer, the second work function metal layer, and the first work function metal layer outside of the first opening and the second opening.

5. The method for forming a semiconductor device as claimed in claim 1, wherein the forming the first work function metal layer comprises a chemical vapor deposition process, an atomic layer deposition process, or a physical vapor deposition process.

6. The method for forming a semiconductor device as claimed in claim 1, wherein the formation of the second work function metal layer comprises an atomic layer deposition process or a chemical vapor deposition process.

7. The method for forming a semiconductor device as claimed in claim 6, wherein an incubation time of the atomic layer deposition process or the chemical vapor deposition process for forming the second work function metal layer ranges from about 0.1 minutes to about 3 minutes.

8. A method for forming a semiconductor device, comprising:
providing a semiconductor substrate with an insulating layer formed thereon, wherein the insulating layer has a first opening and a second opening;
forming a gate dielectric layer in the first opening and the second opening;
forming a film over the gate dielectric layer, wherein the film comprises a barrier layer or a metal layer;
forming a first work function metal layer over the film in the first opening; and
forming a second work function metal layer in the first opening and the second opening and in direct contact with the first work function metal layer in the first opening and the film in the second opening, wherein the second work function metal layer has a first portion over the first work function metal layer and a second portion over the film, a deposition rate of the first portion of the second work function metal layer over the first work function metal layer is greater than a deposition rate of the second portion of the second work function metal layer over the film, and the first portion of the second work function metal layer is thicker than the second portion of the second work function metal layer.

9. The method for forming a semiconductor device as claimed in claim 8, further comprising:
forming a third work function metal layer over the second work function metal layer in the first opening and the second opening.

10. The method for forming a semiconductor device as claimed in claim 8, wherein the formation of the second work function metal layer comprises an atomic layer deposition process or a chemical vapor deposition process.

11. The method for forming a semiconductor device as claimed in claim 8, further comprising:
forming a gate electrode layer over the second work function metal layer.

12. The method for forming a semiconductor device as claimed in claim 11, wherein the formation of the film comprises:
depositing the film in the first opening and the second opening, wherein the first work function metal layer is formed over the film.

13. The method for forming a semiconductor device as claimed in claim 12, wherein the formation of the first work function metal layer, the second work function metal layer, and the gate electrode layer comprises:
depositing the first work function metal layer in the first opening;
depositing the second work function metal layer in the first opening and the second opening and over the insulating layer;
depositing the gate electrode layer over the second work function metal layer; and
removing the gate electrode layer, the second work function metal layer, and the first work function metal layer outside of the first opening and the second opening.

14. A method for forming a semiconductor device, comprising:
providing a semiconductor substrate with an insulating layer formed thereon, wherein the insulating layer has a first opening and a second opening;
forming a gate dielectric layer in the first opening and the second opening;
forming a film over the gate dielectric layer, wherein the film comprises a barrier layer or a metal layer;
forming a first work function metal layer in the first opening; and
depositing a second work function metal layer in the first opening and the second opening and in direct contact with the first work function metal layer in the first opening and the film in the second opening, wherein the second work function metal layer and the first work function metal layer comprise a same metal element, and the second work function metal layer and the film are made of different materials and do not comprise a same metal element.

15. The method for forming a semiconductor device as claimed in claim 14, further comprising:
forming a third work function metal layer over the second work function metal layer in the first opening and the second opening.

16. The method for forming a semiconductor device as claimed in claim 15, further comprising:
forming a gate electrode layer over the third work function metal layer.

17. The method for forming a semiconductor device as claimed in claim 14, wherein the formation of the second work function metal layer comprises an atomic layer deposition process or a chemical vapor deposition process.

18. The method for forming a semiconductor device as claimed in claim 14, wherein the metal element comprises titanium, aluminum, or tantalum.

* * * * *